(12) United States Patent
Li et al.

(10) Patent No.: US 9,171,879 B2
(45) Date of Patent: Oct. 27, 2015

(54) METHOD FOR FABRICATING SENSOR

(71) Applicant: BEIJING BOE OPTOELECTRONICS TECHNOLOGY CO., LTD., Beijing (CN)

(72) Inventors: Tiansheng Li, Beijing (CN); Xiaohui Jiang, Beijing (CN); Shaoying Xu, Beijing (CN); Zhenyu Xie, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 106 days.

(21) Appl. No.: 14/123,992

(22) PCT Filed: Nov. 16, 2012

(86) PCT No.: PCT/CN2012/084775
§ 371 (c)(1),
(2) Date: Dec. 5, 2013

(87) PCT Pub. No.: WO2014/015583
PCT Pub. Date: Jan. 30, 2014

(65) Prior Publication Data
US 2015/0194461 A1  Jul. 9, 2015

(30) Foreign Application Priority Data
Jul. 26, 2012  (CN) .......................... 2012 1 0262971

(51) Int. Cl.
H01L 27/146  (2006.01)
(52) U.S. Cl.
CPC .... *H01L 27/14687* (2013.01); *H01L 27/14643* (2013.01); *H01L 27/14689* (2013.01)

(58) Field of Classification Search
CPC ................. H01L 27/14603; H01L 27/14692; H01L 27/14643; H01L 27/14689; H01L 29/78669; H01L 29/66765; H01L 23/481; H01L 31/18; H01L 31/1055; H01L 31/0256; H01L 31/0352; H01L 31/02325
USPC ................. 438/57, 59, 65, 66, 73, 151, 155
See application file for complete search history.

(56) References Cited

U.S. PATENT DOCUMENTS

| 5,306,648 A | 4/1994 | Fukaya et al. | |
| 8,962,371 B2 * | 2/2015 | Xu et al. | 438/59 |

(Continued)

FOREIGN PATENT DOCUMENTS

KR   20120027541 A   3/2012

OTHER PUBLICATIONS

International Preliminary Report on Patentability dated Jan. 27, 2015; PCT/CN2012/084775.

(Continued)

*Primary Examiner* — Savitr Mulpuri
(74) *Attorney, Agent, or Firm* — Ladas & Parry LLP

(57) ABSTRACT

A method for fabricating a sensor, comprising: forming a pattern of a bias line on a base substrate by using a first patterning process; forming a pattern of a transparent electrode, a pattern of a photodiode, a pattern of a receive electrode, a pattern of a source electrode, a pattern of a drain electrode, a pattern of a data line and a pattern of an ohmic layer by using a second patterning process; forming a pattern of an active layer, a pattern of a first passivation layer, a pattern of a gate electrode and a pattern of a gate line by using a third patterning process. The above method reduces the number of used mask in the fabrication processes as well as the production cost and simplifies the production process, thereby significantly improves the production capacity and the yield rate.

10 Claims, 4 Drawing Sheets

(56) References Cited

U.S. PATENT DOCUMENTS

| | | |
|---|---|---|
| 2010/0320391 A1 | 12/2010 | Antonuk |
| 2011/0263084 A1 | 10/2011 | Yamazaki |
| 2014/0077212 A1* | 3/2014 | Li et al. .......................... 257/59 |
| 2014/0231804 A1* | 8/2014 | Yan et al. ........................ 257/53 |
| 2015/0008435 A1* | 1/2015 | Xu et al. ......................... 257/66 |
| 2015/0014751 A1* | 1/2015 | Li et al. ......................... 257/229 |

OTHER PUBLICATIONS

Korean Office Action dated Jan. 29, 2015: Appln. No. 10-2013-7035100.

First Chinese Office Action dated Jun. 23, 2014; Appln. No. 201210262971.4.

Korean Notice of Allowance dated Jun. 2, 2015; Appln. No. 10-2013-7035100.

* cited by examiner

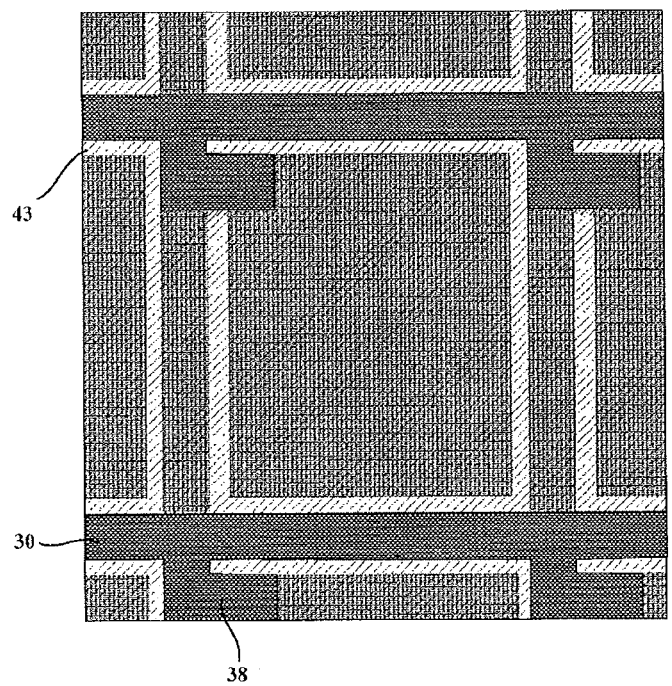
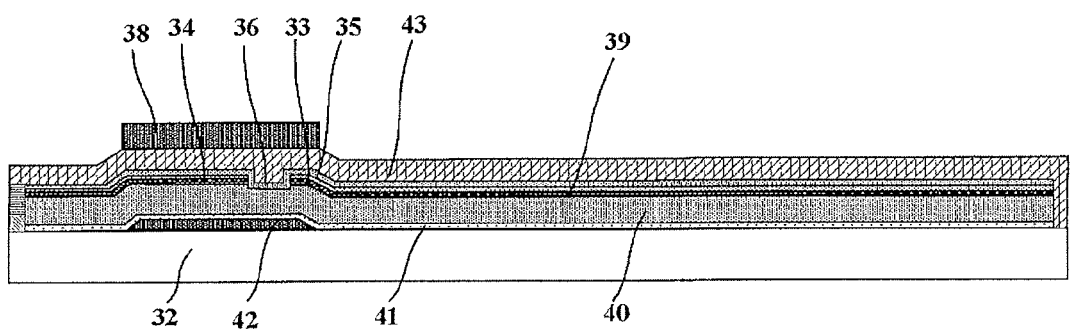
Fig. 4a
Fig. 4b

METHOD FOR FABRICATING SENSOR

FIELD OF THE ART

Embodiments of the invention relate to a method for fabricating a sensor.

BACKGROUND

For healthy reasons, various non-invasive medical diagnosis methods are becoming widely accepted by people. Among the various non-invasive medical diagnosis methods, Computed Tomography (CT) is already generally used. An indispensable component used in CT equipments is a sensor.

FIG. 1 illustrates a basic configuration of a sensor. The sensor 12 comprises a plurality of scan lines 15, a plurality of data lines 16 and a plurality of sensing elements; each sensing element comprises a photodiode 13 and a Field Effect Transistor (FET) 14. The gate of the FET 14 is connected to a corresponding scan line 15 of the sensor 12, the source of the FET 14 is connected to a corresponding data line 16 of the sensor, and the drain of the FET 14 is connected to the photodiode 13. One end of the date lines 16 is connected to a data readout circuit 18 via a connecting pin 17.

The working principle of the above sensor is as follows: the sensor 12 supplies a scan drive signal via the scan lines 15 to control the ON/OFF state of the FET 14 of each sensing element. When the FET 14 is turned on, the photocurrent signal generated by the photodiode 13 is output sequentially via the data line 16 connected to the FET 14 and the data readout circuit 18, and capturing of the photocurrent signal is realized by controlling timing of signals on the scan line 15 and the data line 16. That is to say, the capturing of the photocurrent signal generated by the photodiode 13 is controlled by controlling the ON/OFF state of the FET 14.

Currently, sensors generally employ a thin film transistor (TFT) plate configuration. Such a sensor may have many layers in its cross section. For example, each sensing element comprises a substrate, a gate electrode layer, a gate insulating layer, an active layer, a source electrode and a drain electrode layer, a passivation layer. PIN junction of the PIN photoelectric sensor, a transparent electrode window layer, and a bias line layer as well as a light-shield strip layer. Detailed patterning layers may differ from each other for different sensors, depending on the specific configuration of the sensors.

Individual patterning layers of the sensor are generally formed via patterning processes and each patterning process generally comprises steps of masking, developing, exposing, etching and peeling. That is to say, multiple patterning processes are needed to realize multiple patterning layers of the sensor. For example, 9 to 11 patterning processes are needed to form a multi-layer sensor as described above, thereby 9 to 11 masks are required, which makes the fabrication cost high and the process complicated and the production capacity difficult to increase.

SUMMARY

An objective of the invention is to provide a method for fabricating a sensor, so as to solve the problem of sensors having high production cost and complicated fabrication processes and difficulty in improving the production capacity of the conventional art.

A first aspect of the invention provides a method for fabricating a sensor comprising:

forming a pattern of a bias line on a base substrate by using a first patterning process;

forming a pattern of a transparent electrode on and electrically contacting the bias line, a pattern of a photodiode on the transparent electrode, a pattern of a receive electrode on the photodiode, a pattern of a source electrode connected to the receive electrode and a pattern of a drain electrode disposed opposed to the source electrode to form a channel, and a pattern of a data line connected to the drain electrode and a pattern of an ohmic layer on the source electrode and the drain electrode, by using a second patterning process;

forming a pattern of an active layer on the ohmic layer and the channel, a pattern of a first passivation layer on the active layer and overlaying the base substrate, a pattern of a gate electrode on the first passivation layer and above the channel, and a pattern of a gate line connected to the gate electrode, by using a third patterning process.

In comparison with the conventional art, the method of the invention reduces the number of used mask as well as the production cost and simplifies the production process, thereby significantly improves the production capacity and the yield rate. Moreover, when the fabricated sensor is functioning, the light is directly transmitted to the photodiode sensing device via the base base substrate. In comparison with the conventional sensors, the optical loss is significantly reduced and the optical absorption ratio improved, thereby improving the picture quality and reducing the power consumption.

BRIEF DESCRIPTION OF THE DRAWINGS

In order to clearly illustrate the technical solution of the embodiments of the invention, the drawings of the embodiments will be briefly described in the following. It is obvious that the described drawings are only related to some embodiments of the invention and thus are not limitative of the invention.

FIG. 4a is a top view after the third patterning process of a sensing element in accordance with an embodiment of the invention;

FIG. 4b is a cross section view after the third patterning process of the sensing element in accordance with an embodiment of the invention;

NUMERAL REFERENCES

Figure 1:
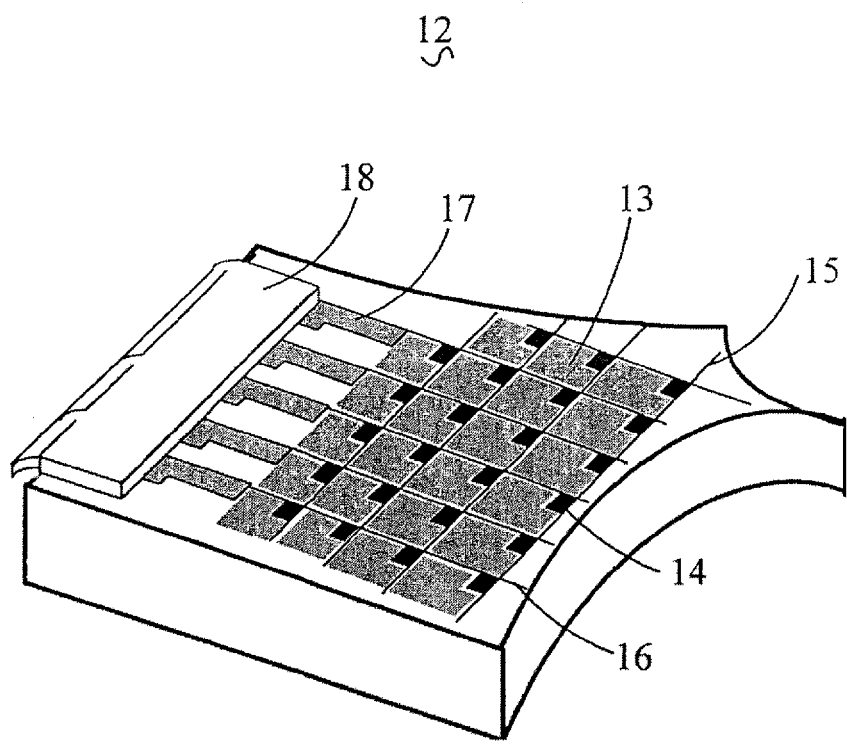
FIG. 1 schematically illustrates a three-dimensional (3D) configuration of a conventional sensor.

12: sensor; 13: photodiode; 14: FET
15: scan line 16: data line 17: connecting pin
18: data readout circuit 30: gate line 31: data line 32: base substrate 33: source electrode 34: drain electrode
35: ohmic layer 36: active layer 42: bias line
38: gate electrode 39: receive electrode 40: photodiode
41: transparent electrode 57: second passivation layer
43: first passivation layer

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the embodiments of the invention described below, a sensor may comprise many types of sensors, such as an X-ray sensor and the like. A sensor in accordance with an embodiment of the invention comprises a plurality of gate lines, a plurality of data lines and a plurality of sensing elements defined by the gate lines and the data lines and arranged as an array; each sensing element comprises a TFT device and a photodiode sensing device. The following descriptions and drawings are directed to a single sensing element, though other sensing elements may be formed in the same way.

An embodiment of the invention provides a method for fabricating a sensor to address the technical problems of sensors having high fabrication cost and complicated fabrication processes and difficulty in increasing the product capacity in the conventional art. The method comprises:

Step 101: a single patterning process is used to form a pattern of a bias line 42 on a base substrate 32.

Figure 2A:
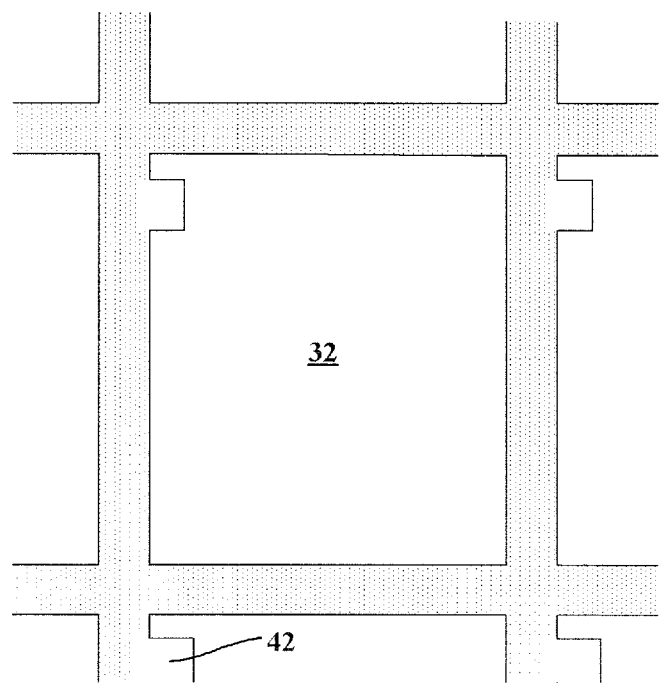
FIG. 2a is a top view after the first patterning process of a sensing element in accordance with an embodiment of the invention.
Figure 2B:
FIG. 2b is a cross section view after the first patterning process of the sensing element in accordance with an embodiment of the invention.
Figure 5A:
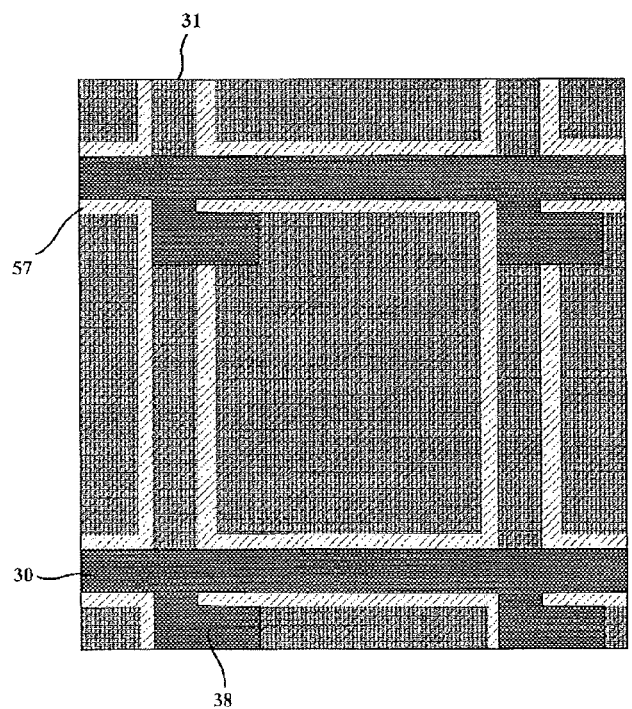
FIG. 5a is a top view after the fourth patterning process of a sensing element in accordance with an embodiment of the invention.
Figure 5B:
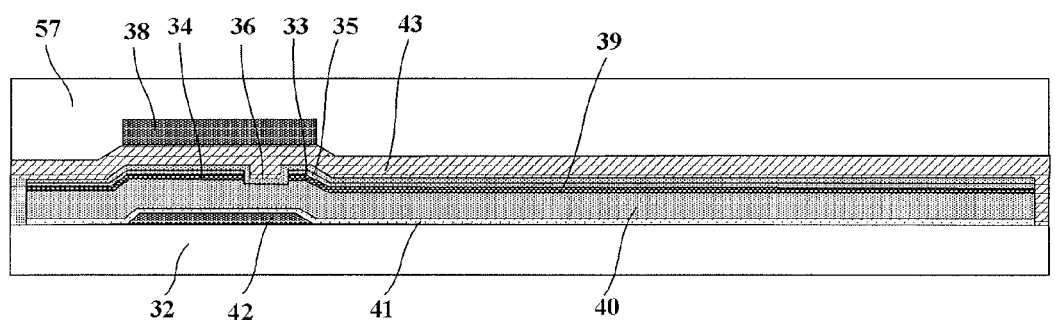
FIG. 5b is a cross section view after the fourth patterning process of the sensing element in accordance with an embodiment of the invention.

For the configuration of the substrate after the first patterning process please refer to FIGS. 2a and 2b. For convenience reasons, FIG. 2b only illustrates a cross section of one of the sensing elements on the substrate. FIGS. 3b, 4b and 5b are illustrated in a similar way.

Generally, a patterning process sequentially comprises steps of substrate cleaning, film forming, photoresist application, exposure, developing, etching, photoresist removal and so on. The substrate may be cleaned using de-ionized water or an organic cleanser. The film forming process is used to form the structural layers to be patterned. For example, a metal layer is generally formed using Physical Vapor Deposition (PVD) (such as magnetron sputtering), and then wet etched to form a pattern. While a non-metal layer is usually formed using Chemical Vapor Deposition (CVD) and then dry etched to form a pattern. Patterning processes in the following steps are the same and will not be elaborated.

In an embodiment of the invention, the base substrate 32 may be a glass substrate, a plastic substrate or a substrate made of other materials. A material of the bias line 42 may be a single layer of film made of aluminum neodymium (AlNd) alloy, aluminum (Al), copper (Cu), molybdenum (Mo), molybdenum tungsten (MoW) alloy or chromium (Cr), or a multi-layer film made of any combination of these metal elements or alloy materials. The single layer or multi-layer film may have a thickness of for example 150 nm to 450 nm.

Step 102: a single patterning process is used to form a pattern of a transparent electrode 41 on and electrically contacting the bias line 42, a pattern of a photodiode 40 on the transparent electrode 41, a pattern of a receive electrode 39 on the photodiode 40, a pattern of a source electrode 33 connected to the receive electrode 39 and a pattern of a drain electrode 34 disposed opposed to the source electrode 33 to form a channel, and a pattern of a data line 31 connected to the drain electrode 34 and a pattern of an ohmic layer on the source electrode 33 and the drain electrode 34. For the configuration of the substrate after the second patterning process please refer to FIGS. 3a and 3b.

In an embodiment of the invention, a material of the transparent electrode 41 may be transparent conductive materials such as indium tin oxides (ITO) or indium zinc oxides (IZO). The source electrode 33, the drain electrode 34, the data line 31 and the receive electrode 39 may be of the same material or of different materials. Preferably, they are made of the same material (e.g., the same material as the bias line) such that they may be formed via a same and one deposition and etching thereby simplifying the fabrication process and improving the production efficiency. A material of the ohmic layer 35 may be for example a doped semiconductor (n+a-Si).

In an embodiment of the invention, the photodiode 40 may be a PIN photodiode, as the PIN photodiode has the advantages of having small junction capacitance, short transit time and high sensitivity. However, in other embodiments of the invention, the photodiode may be a MIS (Metal-Insulator-Semiconductor)-type photodiode and the like.

More specifically, in an embodiment of the invention, the above step 102 may comprise the following steps:

102a: sequentially depositing a transparent conductive material layer, a photodiode material layer, a data line metal layer and an ohmic material layer, and applying a photoresist onto the ohmic material layer;

102b: exposing and developing the photoresist on the substrate using a mask having a light-transmitting portion, a partial-light-transmitting portion and a light-blocking portion to obtain a photoresist pattern having a photoresist-completely-removed region, a photoresist-partially-removed region and a photoresist-completely-retained region;

102c: etching the photoresist-completely-removed region on the substrate; and

102d: ashing the photoresist-partially-removed region on the substrate, removing the photoresist in the photoresist-partially-removed region and retaining the photoresist in the photoresist-completely-retained region, and then etching and removing the photoresist to form the pattern of the channel.

In the above description, positive photoresist is used as an example of the photoresist, in which the light-transmitting portion, the partial-light-transmitting portion and the light-blocking portion of the mask are respectively used to expose the photoresist completely, partially and not at all, and the photoresist is developed to obtain the photoresist-completely-removed region, photoresist-partially-removed region and photoresist-completely-retained region. The photoresist in the photoresist-completely-retained region is substantially completely retained.

In the case that the photodiode 40 is a PIN photodiode, depositing the photodiode material layer on the transparent conductive material layer of the above step 102a may comprise sequentially depositing the following layers: a P-type semiconductor layer (p+a-Si), an I-type semiconductor layer (a-Si) and a N-type semiconductor layer (n+a-Si). More specifically, the P-type semiconductor layer is deposited on the transparent conductive material layer, the I-type semiconductor layer is deposited on the P-type semiconductor layer and the N-type semiconductor layer is deposited on the I-type semiconductor layer.

In the above step 102b, the partial-light-transmitting portion of the mask correspondingly forms the region having the channel, the light-blocking portion of the mask correspondingly forms the region having the source electrode 33, the drain electrode 34, the data line 31 and the receive electrode 39. In this step, the mask may be a dual-tone mask (such as a gray-tone mask or a half-tone mask).

Step 103: a single patterning process is used to form a pattern of an active layer 36 disposed on the ohmic layer 35 and above the channel, a pattern of a first passivation layer 43 on the active layer 36 and overlaying the base substrate, a pattern of a gate electrode 38 on the first passivation layer 43 and above the channel, and a pattern of a gate line 30 connected to the gate electrode 38. For the configuration of the substrate after the second patterning process please refer to FIGS. 4a and 4b.

In an embodiment of the invention, a material of the active layer 36 may be a semiconductor material such as amorphous silicon (a-Si) with a thickness of 30 nm to 250 nm; a material of the first passivation layer 43 (and the second passivation layer 57 described below) may be an inorganic insulating film (such as silicon nitrides) or an organic insulating film (such as a photosensitive resin material or a non-photosensitive resin) with a thickness of, for example, 1000 nm to 2000 nm; the gate electrode 38 and the gate line 30 may be of the same material as the bias line 42.

More specifically, in an embodiment of the invention, the above step 103 may comprise the following steps:

103a: sequentially depositing an active material layer, a first passivation layer and a gate metal layer;

13b: etching the gate metal layer to form the pattern of the gate electrode 38 and the pattern of the gate line 30.

In the above step 103a, the pattern of the active layer 36 is formed right away when being deposited, with no need for etching. This is due to that a broken region exposing the base substrate 32 is formed after step 102. As the active material layer is relatively thin (with a thickness of 30 nm to 250 nm), broken portion will be Ruined in the broken region, thereby forming the pattern of the active layer 36. However, the first passivation layer 43 is relatively thick, thereby no broken portion is formed therein.

Step 104: a single patterning process is used to form a pattern of a second passivation layer 57 overlaying the base substrate, where the second passivation layer 57 has a signal-transmitting area via hole. A configuration of the substrate as shown in FIGS. 5a and 5b are formed with the four patterning processes. As FIG. 5b is a cross section of a sensing element of the sensor in accordance with the embodiment of the invention, the signal-transmitting area via hole at the peripheral of the substrate is not shown.

Please note that step 104 is optional, as the invention can still be realized without step 104. Therefore, in an embodiment, the method for fabricating the sensor may only comprises the above steps 101 to 103.

It is seen from above that the fabrication method for the sensor of the invention can use three or four patterning processes in total. In comparison with the conventional art, it reduces the number of used masks as well as the production cost and simplifies the production process, thereby significantly improving the production capacity and the yield rate.

A sensor having the configurations as illustrated in FIGS. 5a and 5b is obtained with the fabrication method according to the above embodiment of the invention. The sensor comprises: a base substrate 32, a group of gate lines 30 and a group of data lines 31 arranged as crossing each other, and a plurality of sensing elements arranged in an array and defined by the group of gate lines 30 and the group of data lines 31. Each sensing element comprises a TFT device and a photodiode sensing device.

The photodiode sensing device comprises: a bias line 42 disposed on the base substrate 32; a transparent electrode 41 disposed on and electrically contacting the bias line 42; a photodiode 40 disposed on the transparent electrode 41; and a receiving electrode 39 disposed on the photodiode 40.

The TFT device comprises: a source electrode 33 disposed on the photodiode 40 and connected to the receive electrode 39; a drain electrode 34 disposed on the photodiode 40 and connected to a neighboring data line 31; the source electrode 33 and the drain electrode 34 are disposed opposed to each other to form a channel; an ohmic layer 35 disposed on the source electrode 33 and the drain electrode 34; an active layer 36 disposed on the ohmic layer 35 and over the channel; a first passivation layer 43 disposed on the active layer 36 and overlaying the base substrate; and a gate electrode 38 disposed on the first passivation layer 43 and over the channel, the gate electrode is connected to a neighboring gate line 30.

In an embodiment, the sensor may further comprises a second passivation layer 57 disposed on the gate electrode 38 and overlaying the base substrate, where the second passivation layer 57 has a signal-transmitting area via hole.

Figure 3A:
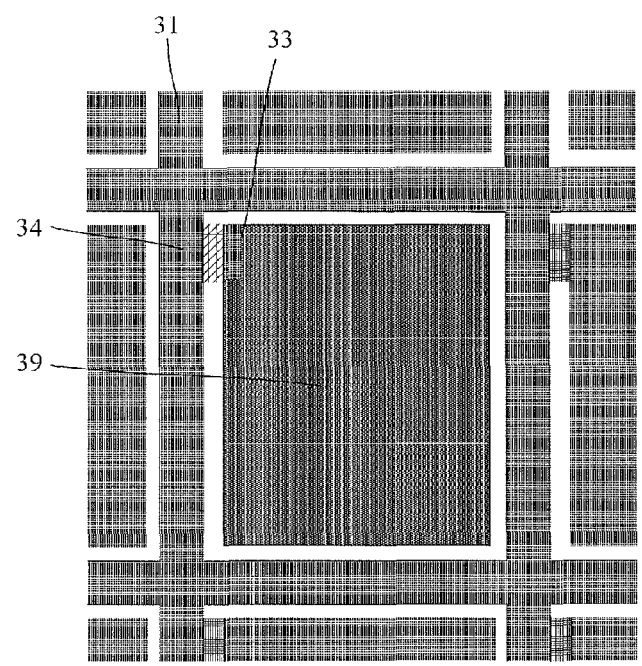
FIG. 3a is a top view after the second patterning process of a sensing element in accordance with an embodiment of the invention.
Figure 3B:
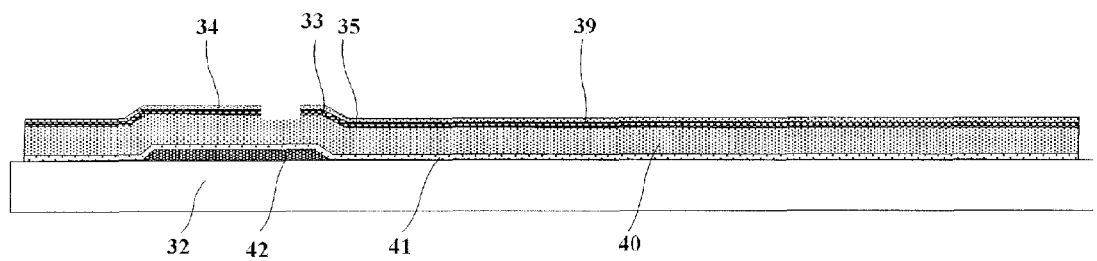
FIG. 3b is a cross section view after the second patterning process of the sensing element in accordance with an embodiment of the invention.

In the embodiment, the bias line 42 has a grid shape, and each lattice in the grip corresponds to a sensing element (as illustrated in FIG. 3a). However, the shape of the bias line is not limited to the grid. For example, it may also be disposed parallel to the data line or the gate line.

In the sensor, the bias line is fabricated as the first layer on the base substrate. When the sensor is functioning, the light is incident from a side of the base substrate and directly transmitted to the photodiode sensing device via the base substrate. In comparison with the conventional sensors, the optical loss is significantly reduced and the optical absorption ratio is improved, thereby improving the picture quality and reducing the power consumption.

What are described above is related to the illustrative embodiments of the disclosure only and not limitative to the scope of the disclosure; the scopes of the disclosure are defined by the accompanying claims.

What is claimed is:

1. A method for fabricating a sensor comprising:
   forming a pattern of a bias line on a base substrate by using a first patterning process;
   forming a pattern of a transparent electrode on and electrically contacting the bias line, a pattern of a photodiode on the transparent electrode, a pattern of a receive electrode on the photodiode, a pattern of a source electrode connected to the receive electrode and a pattern of a drain electrode disposed opposed to the source electrode to form a channel, a pattern of a data line connected to the drain electrode and a pattern of an ohmic layer on the source electrode and the drain electrode, by using a second patterning process;
   forming a pattern of an active layer on the ohmic layer and the channel, a pattern of a first passivation layer on the active layer and overlaying the base substrate, a pattern of a gate electrode on the first passivation layer and above the channel, and a pattern of a gate line connected to the gate electrode, by using a third patterning process; and forming a pattern of a second passivation layer overlaying the base substrate by using the fourth patterning process, wherein the second passivation layer has a signal-transmitting area via hole, wherein forming the pattern of the second passivation layer is performed after forming the pattern of the gate electrode and the pattern of the gate line.

2. The method of claim 1, wherein forming the pattern of the transparent electrode, the pattern of the photodiode, the pattern of the receive electrode, the pattern of the source electrode, the pattern of the drain electrode, the pattern of the data line and the pattern of the ohmic layer by using the second patterning process comprises:
- sequentially depositing a transparent conductive material layer, a photodiode material layer, a data line metal layer and an ohmic material layer, and applying a photoresist onto the ohmic material layer;
- exposing and developing the photoresist on the base substrate using a mask having a light-transmitting portion, a partial-light-transmitting portion and a light-blocking portion to obtain a photoresist pattern having a photoresist-completely-removed region, a photoresist-partially-removed region and a photoresist-completely-retained region;
- etching the photoresist-completely-removed region on the base substrate; and
- ashing the photoresist-partially-removed region on the base substrate, removing the photoresist in the photoresist-partially-removed region and retaining the photoresist in the photoresist-completely-retained region, and then etching and removing the photoresist to form the pattern of the channel.

3. The method of claim 2, wherein the partial-light-transmitting portion correspondingly forms the region having the channel, the light-blocking portion correspondingly forms the region having the source electrode, the drain electrode, the data line and the receive electrode.

4. The method of claim 2, wherein depositing the photodiode material layer comprises sequentially depositing a P-type semiconductor layer, an I-type semiconductor and a N-type semiconductor layer.

5. The method of claim 1, wherein forming the pattern of the active layer, the pattern of the first passivation layer, the pattern of the gate electrode and the pattern of the gate line by using the third patterning process comprises:
- sequentially depositing an active material layer, a first passivation layer and a gate metal layer and forming the pattern of the active layer;
- etching the gate metal layer to form the pattern of the gate electrode and the pattern of the gate line.

6. The method of claim 1, wherein the source electrode, the drain electrode, the data line and the receiving electrode are of the same material.

7. The method of claim 3, wherein depositing the photodiode material layer comprises sequentially depositing a P-type semiconductor layer, an I-type semiconductor and a N-type semiconductor layer.

8. The method of claim 2, wherein forming the pattern of the active layer, the pattern of the first passivation layer, the pattern of the gate electrode and the pattern of the gate line by using the third patterning process comprises:
- sequentially depositing an active material layer, a first passivation layer and a gate metal layer and forming the pattern of the active layer;
- etching the gate metal layer to form the pattern of the gate electrode and the pattern of the gate line.

9. The method of claim 3, wherein forming the pattern of the active layer, the pattern of the first passivation layer, the pattern of the gate electrode and the pattern of the gate line by using the third patterning process comprises:
- sequentially depositing an active material layer, a first passivation layer and a gate metal layer and forming the pattern of the active layer;
- etching the gate metal layer to form the pattern of the gate electrode and the pattern of the gate line.

10. The method of claim 4, wherein forming the pattern of the active layer, the pattern of the first passivation layer, the pattern of the gate electrode and the pattern of the gate line by using the third patterning process comprises:
- sequentially depositing an active material layer, a first passivation layer and a gate metal layer and forming the pattern of the active layer;
- etching the gate metal layer to form the pattern of the gate electrode and the pattern of the gate line.

* * * * *